(12) United States Patent
Ohhashi (10) Patent No.: US 9,071,006 B2
(45) Date of Patent: Jun. 30, 2015

(54) SEAL STRUCTURE FOR ELECTRONIC CONTROL APPARATUS

(71) Applicant: HITACHI AUTOMOTIVE SYSTEMS, LTD., Ibaraki (JP)

(72) Inventor: Hironori Ohhashi, Isesaki (JP)

(73) Assignee: HITACHI AUTOMOTIVE SYSTEMS, LTD., Hitachinaka-shi (JP)

( * ) Notice: Subject to any disclaimer, the term of this patent is extended or adjusted under 35 U.S.C. 154(b) by 158 days.

(21) Appl. No.: 13/873,461

(22) Filed: Apr. 30, 2013

(65) Prior Publication Data

US 2014/0065877 A1 Mar. 6, 2014

(30) Foreign Application Priority Data

Sep. 4, 2012 (JP) ................................. 2012-193677

(51) Int. Cl.
*H01R 13/52* (2006.01)
*H05K 5/00* (2006.01)

(52) U.S. Cl.
CPC ........ *H01R 13/5213* (2013.01); *H01R 13/5202* (2013.01); *H05K 5/0052* (2013.01)

(58) Field of Classification Search
CPC ........... H01R 13/5213; H01R 13/5202; H05K 5/0052
USPC ............. 174/50.52, 50.53, 564; 439/76.1, 79; 361/752
See application file for complete search history.

(56) References Cited

U.S. PATENT DOCUMENTS

| 6,702,593 | B2 * | 3/2004 | Ogawa ............................ 439/79 |
| 8,354,587 | B2 * | 1/2013 | Tappel et al. ................. 174/50.5 |
| 8,389,856 | B2 * | 3/2013 | Ozawa et al. .............. 174/50.52 |
| 2009/0068862 | A1 | 3/2009 | Honda | |

FOREIGN PATENT DOCUMENTS

JP 2009-70855 4/2009

* cited by examiner

*Primary Examiner* — Dhirubhai R Patel
(74) *Attorney, Agent, or Firm* — Foley & Lardner LLP (57) ABSTRACT

A seal structure includes a connector-lower-surface-side flat seal portion constituted by a surface-joint portion between a lower surface of a connector and a lower housing member; and a groove seal portion constituted between a groove and a protrusion fitted into the groove. The groove is provided in one of inner surfaces of outer circumferential edge portions of an upper housing member and the lower housing member. The protrusion is provided in another of these inner surfaces. The seal structure further includes a linking seal portion connecting the connector-lower-surface-side flat seal portion with the groove seal portion. The linking seal portion includes a deep-bottom portion having a seal groove continuous with the groove seal portion, a shallow-bottom portion having a seal groove shallower than the seal groove of the deep-bottom portion and continuous with the connector-lower-surface-side flat seal portion, and a connecting portion linking the deep-bottom portion to the shallow-bottom portion.

6 Claims, 10 Drawing Sheets

SEAL STRUCTURE FOR ELECTRONIC CONTROL APPARATUS

BACKGROUND OF THE INVENTION

The present invention relates to a seal structure for an electronic control apparatus applicable to an engine control unit, an automatic-transmission control unit and the like.

Figure 10A:
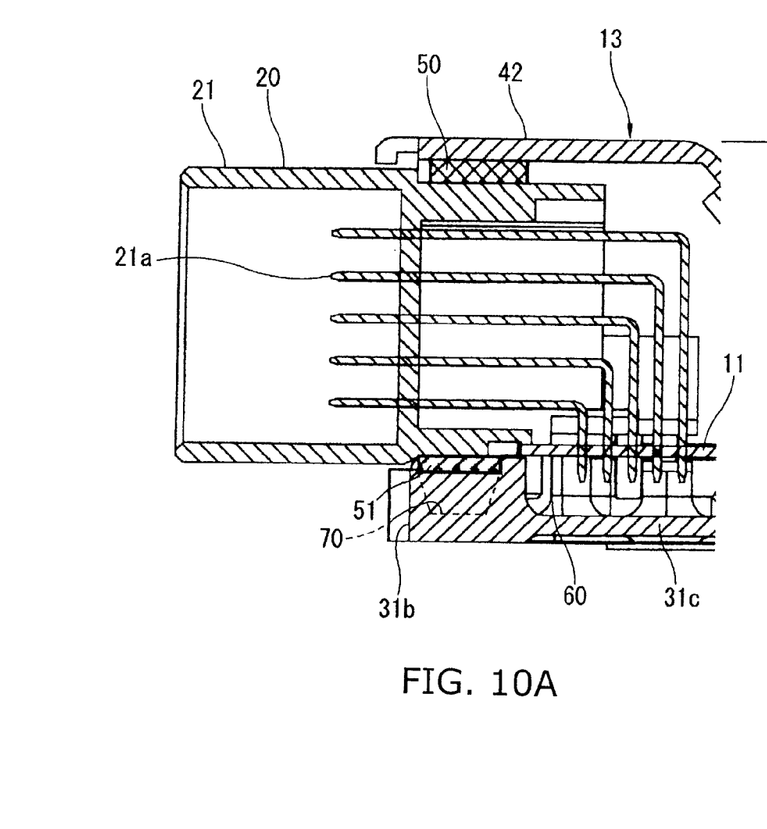
FIG. 10A is a cross-sectional view of the connector seal portion of the electronic control apparatus according to the embodiment of the present invention.
Figure 10B:
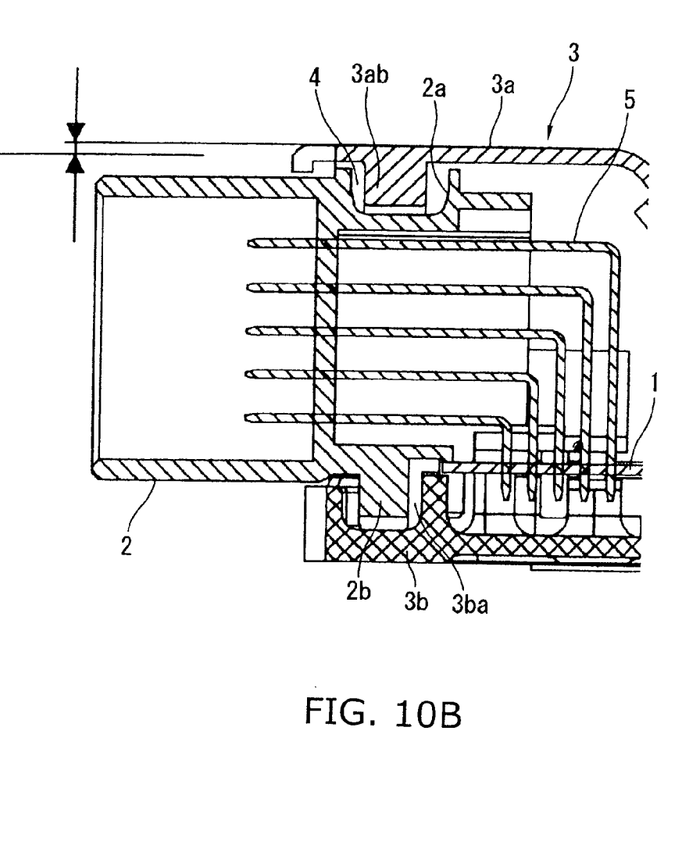
FIG. 10B is a cross-sectional view of a connector seal portion of an electronic control apparatus in a comparative example.

U.S. Patent Application Publication No. 2009/0068862 corresponding to the family Japanese Patent Application Publication No. 2009-70855 discloses a previously proposed seal structure. A seal structure for connector portion of an electronic control apparatus in this technique is close to a structure as shown in FIG. 10B. The electronic control apparatus as FIG. 10B is a so-called connector-side-exposed type in which a part of a connector 2 attached to one side of a circuit board 1 is exposed in a lateral direction of a housing 3 (i.e., in parallel with the circuit board 1) through a window portion of the housing 3. The connector 2 is sandwiched between a pair of members 3a and 3b of the housing 3 in a thickness direction of the circuit board 1. A connector seal portion 4 is provided by charging sealant into a surface-joint portion (surface-contact portion) between an outer circumferential surface of the connector 2 and inner surfaces of the pair of members 3a and 3b of the housing 3 entirely around the connector 2.

In order to secure a predetermined sealing length (also called "leak path"), the connector seal portion 4 is constituted by a seal groove (a connector-side concave portion 2a or a housing-side concave portion 3ba) and a protrusion (a housing-side convex portion 3ab or a connector-side convex portion 2b). A U-shaped clearance between the seal groove and the protrusion is filled with sealant. A reference sign 5 denotes a terminal provided in the connector 2 and connected with a wiring pattern of the circuit board 1.

SUMMARY OF THE INVENTION

In the case that the connector seal portion 4 including such seal groove and protrusion is provided over the entire circumference of the connector 2, a size of the housing 3 surrounding the connector 2 is larger by a depth amount of the seal groove. Thereby, the electronic control apparatus gets larger to reduce a mountability in an engine room and the like.

It is therefore an object of the present invention to provide a seal structure for an electronic control apparatus devised to downsize the electronic control apparatus without damaging a sealing performance.

According to one aspect of the present invention, there is provided a seal structure for an electronic control apparatus, wherein the electronic control apparatus includes a circuit board, a connector attached to one side of the circuit board, and a housing having an upper housing member and a lower housing member between which the connector is sandwiched in a thickness direction of the circuit board, wherein the seal structure comprises: a connector-lower-surface-side flat seal portion constituted by a surface-joint portion filled with sealant between a lower surface of the connector and the lower housing member; a groove seal portion constituted by a clearance filled with sealant between a groove and a protrusion fitted into the groove, the groove being provided in one of inner surfaces of outer circumferential edge portions of the upper housing member and the lower housing member, the protrusion being provided in another of the inner surfaces of the outer circumferential edge portions of the upper housing member and the lower housing member; and a linking seal portion connecting the connector-lower-surface-side flat seal portion with the groove seal portion, the linking seal portion including a deep-bottom portion having a seal groove continuous with the groove seal portion, a shallow-bottom portion having a seal groove shallower than the seal groove of the deep-bottom portion and continuous with the connector-lower-surface-side flat seal portion, and a connecting portion linking the deep-bottom portion to the shallow-bottom portion.

The other objects and features of this invention will become understood from the following description with reference to the accompanying drawings.

BRIEF DESCRIPTION OF DRAWINGS

FIGS. 3A to 3E show an overall structure of the electronic control apparatus according to the embodiment of the present invention.

FIGS. 4A to 4C show a base (lower housing member) of the electronic control apparatus according to the embodiment of the present invention.

FIGS. 6A and 6B show a cover (upper housing member) of the electronic control apparatus according to the embodiment of the present invention.

FIGS. 8A to 8C show the seal structure of the electronic control apparatus according to the embodiment of the present invention.

FIGS. 9A to 9E show the seal structure at a region linking a connector-lower-surface-side flat seal portion to a base-side groove seal portion in the electronic control apparatus according to the embodiment of the present invention.

FIGS. 10A and 10B show a structure around a connector seal portion of an electronic control apparatus constituted by sandwiching a connector attached to one side of a circuit board between a pair of housing members.

DETAILED DESCRIPTION OF THE INVENTION

Hereinafter, embodiments according to the present invention will be explained in detail with reference to the drawings.

Figure 1:
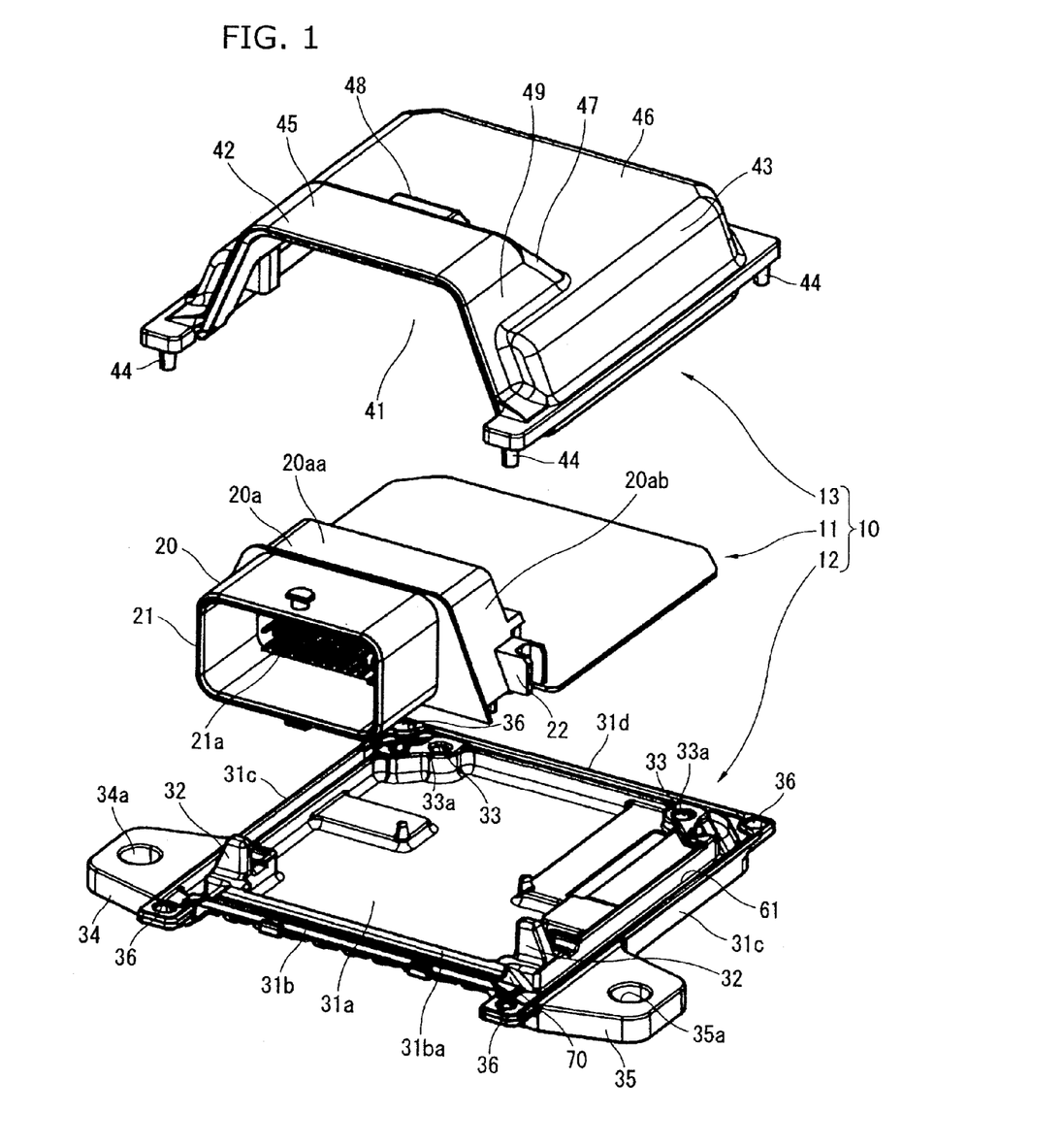
FIG. 1 is an exploded oblique perspective view showing an electronic control apparatus according to an embodiment of the present invention, as viewed from an obliquely upper direction.

Hereinafter, one example in which an electronic control apparatus of the embodiment according to the present invention is applied to an engine control unit of a vehicle (automobile) will be explained in detail referring to the drawings. At first, a basic structure of the electronic control apparatus 10 that accommodates a circuit board (circuit substrate) 11 in an internal space of a housing formed by combining a plurality of housing members (such as a base 12 and a cover 13) with each other will now be explained referring to FIGS. 1 to 3E. In certain embodiments, the base 12 is a lower housing member, and the cover 13 is an upper housing member. In the following explanations, an up-down direction of FIGS. 1 to 3E, i.e., a thickness direction of the circuit board 11 will be sometimes explained as an up-down direction of the electronic control apparatus 10 itself, for the sake of convenience. However, this direction does not necessarily mean a vertical direction (i.e., gravity direction) of the vehicle under a state where the electronic control apparatus 10 has been mounted in the vehicle. That is, for example, in a case that the electronic control apparatus 10 is installed in the vehicle in a posture where the thickness direction of the circuit board 11 is perpendicular to the vertical direction (gravity direction) of the vehicle, the up-down direction of the electronic control apparatus 10 of FIG. 1 means a front-rear direction of the vehicle.

The electronic control apparatus 10 mainly includes the housing and the circuit board 11. The housing is formed by liquid-tightly connecting the base 12 with the cover 13, i.e., by connecting the base 12 with the cover 13 through a sealing agent (sealant). The base 12 is formed substantially in a plate shape, and is attached to a side of vehicle body of the vehicle. The cover 13 is formed substantially in a box shape. The circuit board 11 is accommodated and received in a protection space given inside the housing. Electronic components (not shown) are mounted on the circuit board 11. The electronic control apparatus 10 is mounted in an engine room or the like (not shown), and is attached to the side of vehicle body at bottom surfaces of brackets 34 and 35 of the base 12 each of which functions as an attaching surface to the vehicle body. In this embodiment, these attaching surfaces (the bottom surfaces of the brackets 34 and 35) by which the electronic control apparatus 10 is mounted on the vehicle body side are formed to be parallel to a bottom surface of a bottom wall 31a of the base 12. However, the attaching surfaces (the bottom surfaces of the brackets 34 and 35) may be inclined relative to the bottom surface of the bottom wall 31a of the base 12, in dependence upon a shape and the like of the attaching section to the vehicle body (i.e., in dependence upon shapes of the brackets 34 and 35).

A connector 20 is attached to one part of a circumferential-edge portion of the circuit board 11. The connector 20 includes a connecting port 21 which is connected to an external connector. The connector 20 further includes an attaching base portion 20a. That is, the connector 20 is formed by integrating the connecting port 21 with the attaching base portion 20a. The connector 20 is fixed (fastened) to the circuit board 11 through the attaching base portion 20a, for example, by a plurality of screws.

The connecting port 21 integrated with the attaching base portion 20a is exposed (open) to the external through a window portion 41 of the cover 13. The window portion 41 is a space formed between the base 12 and the cover 13. The connecting port 21 located in the window portion 41 is connected with the external connector (vehicle-body-side connector).

The attaching base portion 20a of the connector 20 includes both lateral surfaces 20ab formed at an angle of about 45 degrees (45°) relative to the surface of the circuit board 11. Each of the both lateral surfaces 20ab is formed with a positioning concave portion 22. Each positioning concave portion 22 is fitted over a positioning projection 32 of the base 12 when the attaching base portion 20a and the circuit board 11 are accommodated inside the housing. That is, the positioning projection(s) 32 which protrudes from a circumferential edge portion of the bottom wall 31a of the base 12 in the upper direction (in the direction toward the cover 13) in a standing manner is fitted into the positioning concave portion 22.

The connector 20 includes a plurality of connector pins (male terminals) 21a which are accommodated in the connecting port 21 and which are electrically connected with a wiring circuit pattern of the circuit board 11. These connector pins 21a are connected respectively with a plurality of female terminals accommodated in the external connector (not shown). Thereby, the wiring circuit pattern of the circuit board 11 is electrically connected through the connector 20 to predetermined devices such as a sensor and a pump connected with the external connectors (the female terminals).

The base 12 is formed substantially in a plate shape, more particularly, formed in a shallow cut-box shape as given by slightly projecting a circumferential edge of a bottom plate from the bottom plate in a direction perpendicular to the bottom plate. The base 12 is integrally formed of a metallic material having a high thermal conductivity such as aluminium. Specifically, the bottom wall 31a formed in a substantially rectangular plate shape includes an outer circumferential edge (four lateral sides) from which a front wall 31b, lateral walls 31c and a back wall 31d project toward the cover 13 in a standing manner. Accordingly, whole the base 12 is open in the upper direction, i.e., toward the cover 13.

A board fixing portion 33 is formed to protrude from a circumferential edge portion of an inner wall surface of the bottom wall 31a of the base 12 in the upper direction in a standing manner. In this embodiment, two board fixing portions 33 are provided at corners of the circumferential edge portion of the inner wall surface of the bottom wall 31a. The circuit board 11 is fixedly attached to the base 12 through the board fixing portions 33. Each of the board fixing portions 33 includes a supporting surface at an upper end portion of the board fixing portion 33. The supporting surface is flat and supports the circuit board 11. The supporting surface of each board fixing portion 33 is formed with a female-threaded hole 33a. By passing a bolt (not shown) through the circuit board 11 and screwing the bolt into the female-threaded hole 33a, the circuit board 11 is fixed to the base 12 under a state where the circuit board 11 is received and supported by the board fixing portions 33.

Moreover, the base 12 includes a pair of brackets 34 and 35 on outer portions of the lateral walls 31c of the base 12. The pair of brackets 34 and 35 are formed integrally with the lateral walls 31c. The bracket 34 is formed with a through-hole 34a passing through the bracket 34 in the up-down direction (i.e., in the direction perpendicular to the bottom wall 31a). The bracket 35 is formed with a through-hole 35a which passes through the bracket 35 in the up-down direction. By inserting bolts and the like into the through-holes 34a and 35a, the electronic control apparatus 10 is attached to the vehicle body (not shown).

The cover 13 is integrally molded by a predetermined synthetic-resin material which is lightweight and low-priced as compared with a metallic material. The cover 13 is formed substantially in an opened-box shape. The cover 13 includes an upper wall portion 42 and a lateral wall 43. The upper wall portion 42 covers the circuit board 11 and the connector 20 from an upper direction of the circuit board 11 and the connector 20 (i.e., from a side opposite to the base 12). The lateral wall 43 fences or surrounds a circumferential edge of the upper wall portion 42 except the window portion 41. That is, the lateral wall 43 protrudes in the lower direction (toward the base 12) from three sides of the substantially-rectangular upper wall portion 42 except the window portion 41 to fence the three sides.

The base 12 includes locking holes 36 formed at four corners (of the front wall 31b, the lateral walls 31c and the back wall 31d) of the base 12. The lateral wall 43 of the cover 13 includes locking projections 44 formed at four locations facing the locking holes 36 of the base 12. Each locking projection 44 is fitted into the locking hole 36 and locked to the locking hole 36. Accordingly, the cover 13 is attached and firmly fixed to the base 12 to which the circuit board 11 and the connector have been attached.

In the electronic control apparatus 10, the connector 20 open in the lateral direction (i.e., the direction parallel to the bottom wall 31a) is attached to one end of the circuit board 11. A dimension (height) of the circuit board 11 is different from a dimension (height) of the connector 20 with respect to the thickness direction of the circuit board 11. Therefore, the cover 13 is formed in a multi-level shape (stepped shape) in dependence upon the heights of the circuit board 11 and the connector 20. Specifically, the upper wall portion 42 which faces through the circuit board 11 and the connector 20 to the base 12 includes an upper-level portion 45 and a lower-level portion 46. The upper-level portion 45 and the lower-level portion 46 are parallel to the attaching surface of the base 12 (i.e., parallel to the bottom surface of the bottom wall 31a).

The upper-level portion 45 covers (an above region of) the connecter 20, and the lower-level portion 46 covers (an above region of) the circuit board 11. The upper-level portion 45 has the dimension (height) larger than that of the lower-level portion 46 with respect to the thickness direction of the circuit board 11. The upper wall portion 42 of the cover 13 further includes a sloped wall portion 47 smoothly linking the upper-level portion 45 to the lower-level portion 46.

The cover 13 includes sloped lateral walls 49 formed over ranges from both lateral ends of the upper-level portion 45 to both lateral ends of the cover 13. That is, each sloped lateral wall 49 extends from the lateral end of the upper-level portion 45 down to the lateral end of the cover 13 along an edge of the window portion 41. Each sloped lateral wall 49 is formed at an angle of about 45 degrees relative to the surface of the circuit board 11, in the same manner as the angle of the lateral surface 20ab of the attaching base portion 20a of the connector 20.

The sloped wall portion 47 is in a flat shape and inclined at a predetermined inclination angle, specifically, substantially at 45 degrees relative to the bottom wall 31a of the base 12. Hence, also relative to the upper-level portion 45 and the lower-level portion 46, the sloped wall portion 47 is inclined at the same inclination angle (45°). Moreover, a protection wall 48 is provided on the sloped wall portion 47. The protection wall 48 functions to protect an air-vent hole (not shown) formed to pass through the sloped wall portion 47 in a thickness direction of the sloped wall portion 47. An air-venting waterproof membrane (thin membrane) such as Gore-Tex (registered trademark) which has both of waterproof and ventilation properties is attached to the air-vent hole. For example, when the vehicle is washed, the protection wall 48 protects the air-venting waterproof membrane from directly receiving a sprayed water having high temperature and high pressure.

A flat seal portion 50 according to this embodiment of the present invention is formed (defined) by charging a sealing agent into a surface-joint portion (surface-contact portion) given between the cover 13 and the attaching base portion 20a of the connector 20. In detail, when the cover 13 is attached to the base 12; an upper surface 20aa of the attaching base portion 20a faces (is opposed to) an inner surface of the upper-level portion 45 of the cover 13, and the both lateral surfaces 20ab of the attaching base portion 20a respectively face (are opposed to) inner surfaces of the sloped lateral walls 49 of the cover 13. At this time, a slight clearance between the upper surface 20aa of the attaching base portion 20a and the inner surface of the upper-level portion 45 of the cover 13 is filled with the sealing agent. Also, a slight clearance between the both lateral surfaces 20ab of the attaching base portion 20a and the inner surfaces of the sloped lateral walls 49 of the cover 13 is filled with the sealing agent.

A connector-lower-surface-side flat seal portion 51, which may be substantially flat according to certain embodiments, is formed (defined) by charging the sealing agent into a surface joint portion (surface-contact portion) 50A given between the base 12 and the attaching base portion 20a of the connector 20. In detail, when the connector 20 is attached to the base 12; a lower surface 20ac of the attaching base portion 20a faces (is opposed to) an upper surface (inner circumferential surface) 31ba of the front wall 31b of the base 12. At this time, a slight clearance between the lower surface 20ac of the attaching base portion 20a and the upper surface 31ba of the front wall 31b of the base 12 is filled with the sealing agent.

Figure 5:
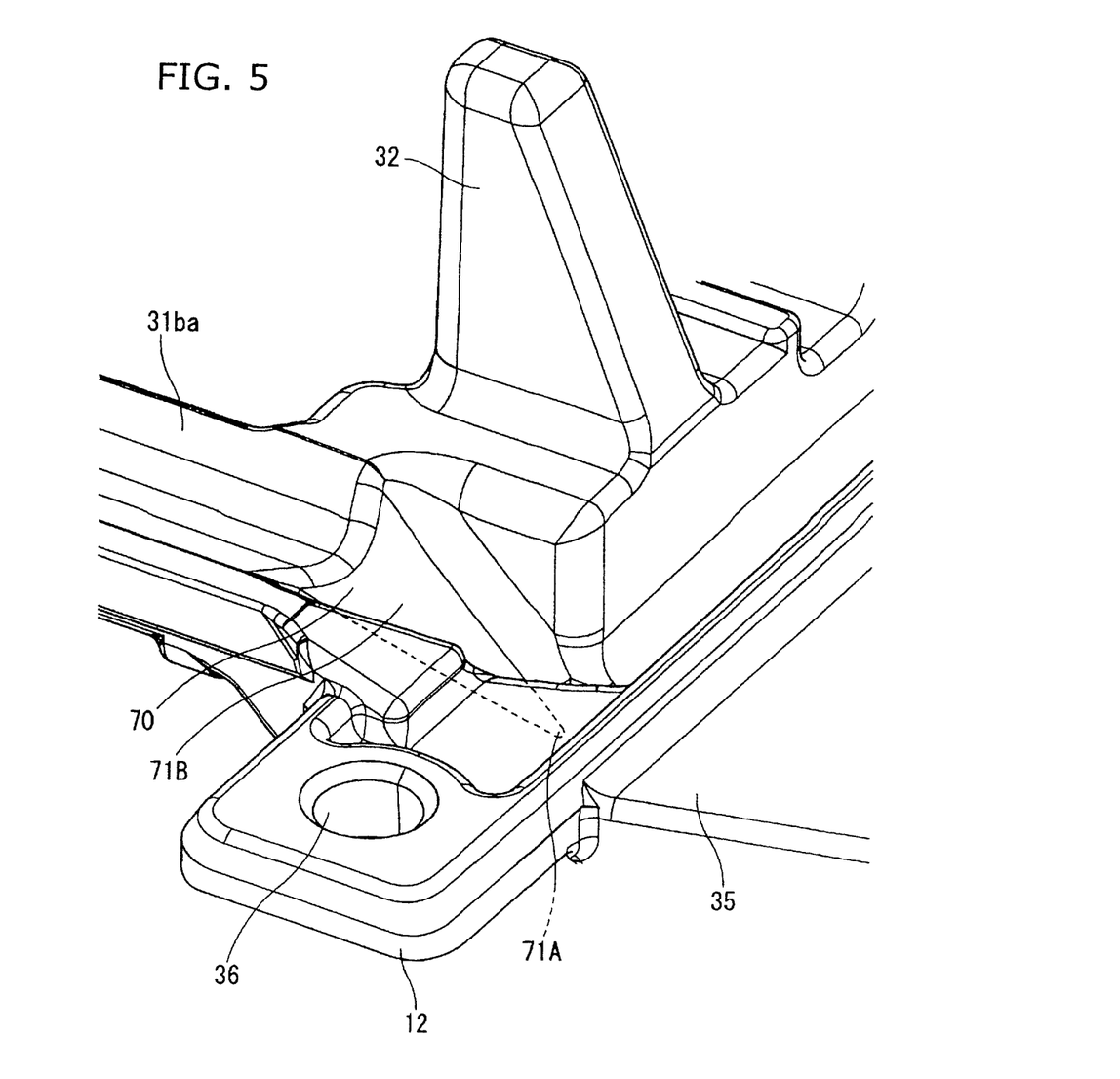
FIG. 5 is an enlarged oblique perspective view of an end portion of the base and shows a seal structure of the electronic control apparatus according to the embodiment of the present invention.

It is noted that the upper surface 31ba of the front wall 31b of the base 12 is formed in a slightly-curved shape as shown in FIG. 5, in order to secure a longer sealing length (or a longer sealing area) of the connector-lower-surface-side flat seal portion 51.

The both lateral walls 31c and the back wall 31d of the base 12 are formed with a continuous seal groove 61. The seal groove 61 is formed continuously along an outer circumferential edge of the base 12 except the front side and has a constant groove depth and a constant groove width.

A portion of an inner circumferential surface of the cover 13 which faces (is opposed to) the seal groove 61 is formed with a protrusion 62. The protrusion 62 is formed over the same range as the seal groove 61. A groove seal portion 60 according to this embodiment of the present invention is formed (defined) by charging the sealing agent into a clearance between the seal groove 61 and the protrusion 62 fitted into the seal groove 61.

Both ends of the connector-lower-surface-side flat seal portion 51 which are closer to the lateral walls 31c are linked respectively to end portions of the groove seal portion 60 which are closer to the front wall 31b, through a flat-to-groove linking seal portion 70 according to the embodiment of the present invention. A sealing agent is charged into the flat-to-groove linking seal portion 70 as explained blow.

Figure 4A:
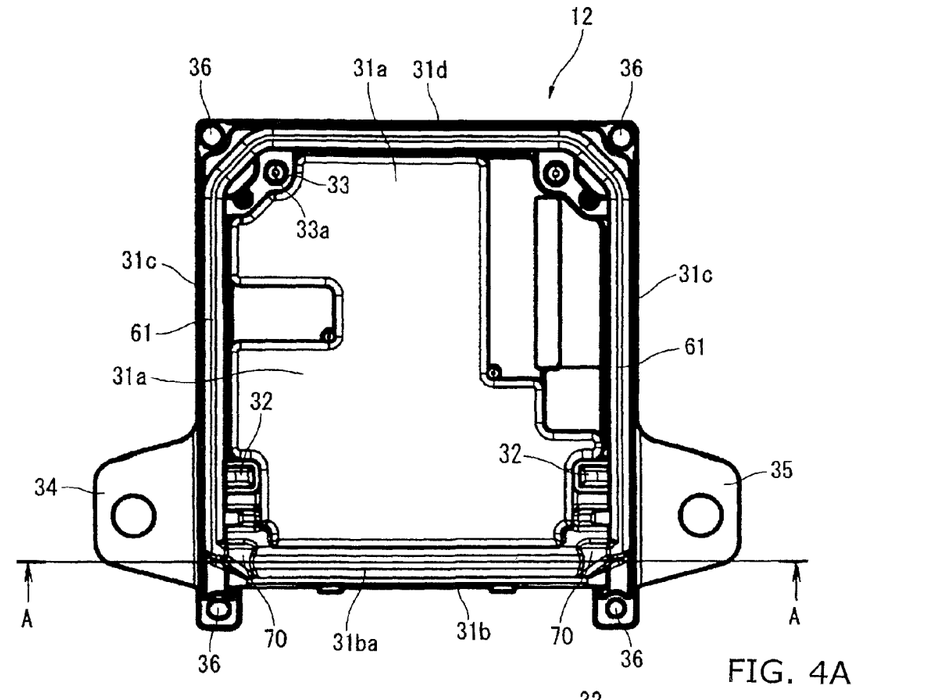
FIG. 4A is top view (plain view) of the base.
Figure 4B:
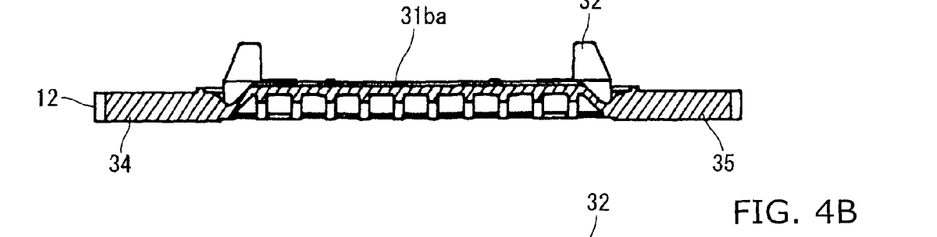
FIG. 4B is a cross-sectional view of FIG. 4A taken along a line A-A and as viewed in an arrow direction of FIG. 4A.
Figure 4C:
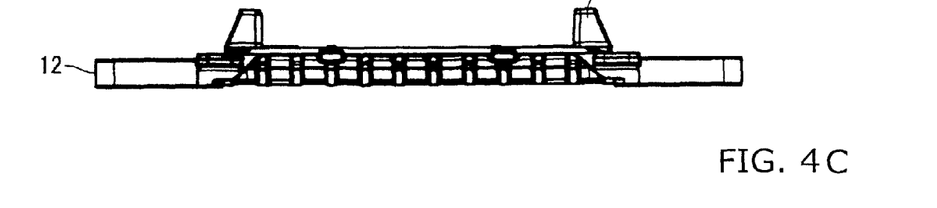
FIG. 4C is a front view of the base.
Figure 6A:
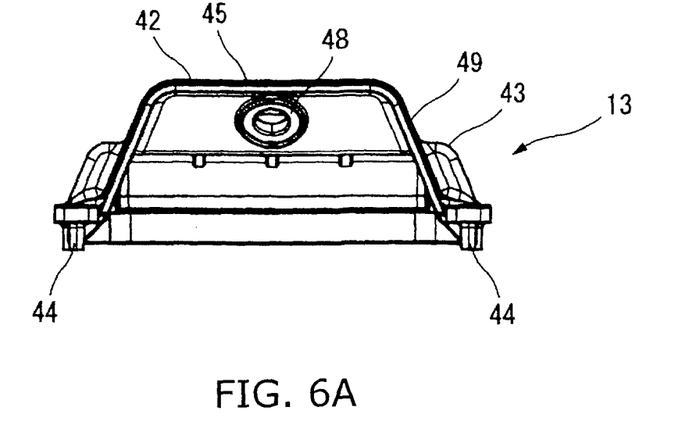
FIG. 6A is a front view of the cover.
Figure 6B:
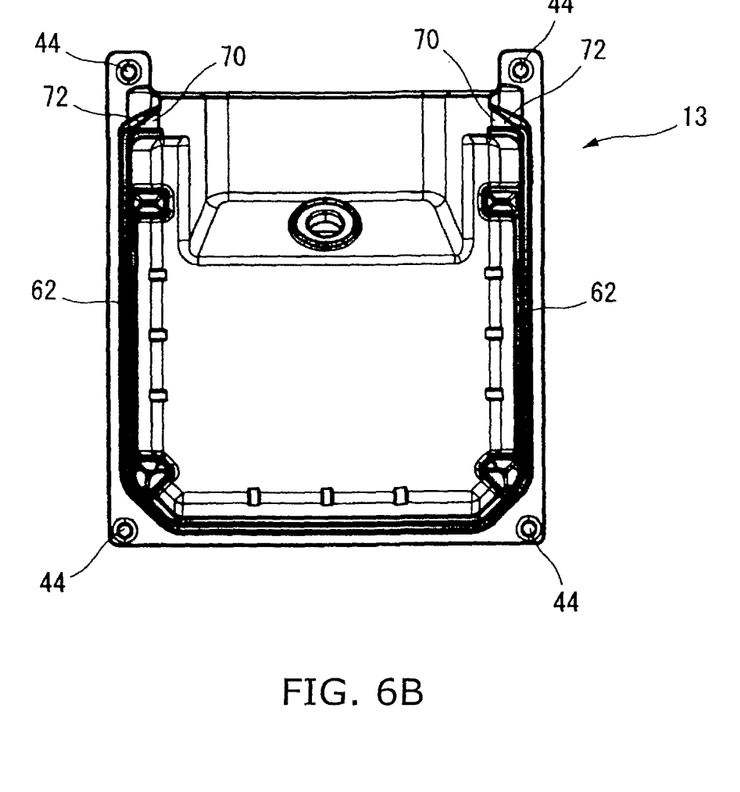
FIG. 6B is a bottom view (reverse view) of the cover.
Figure 7:
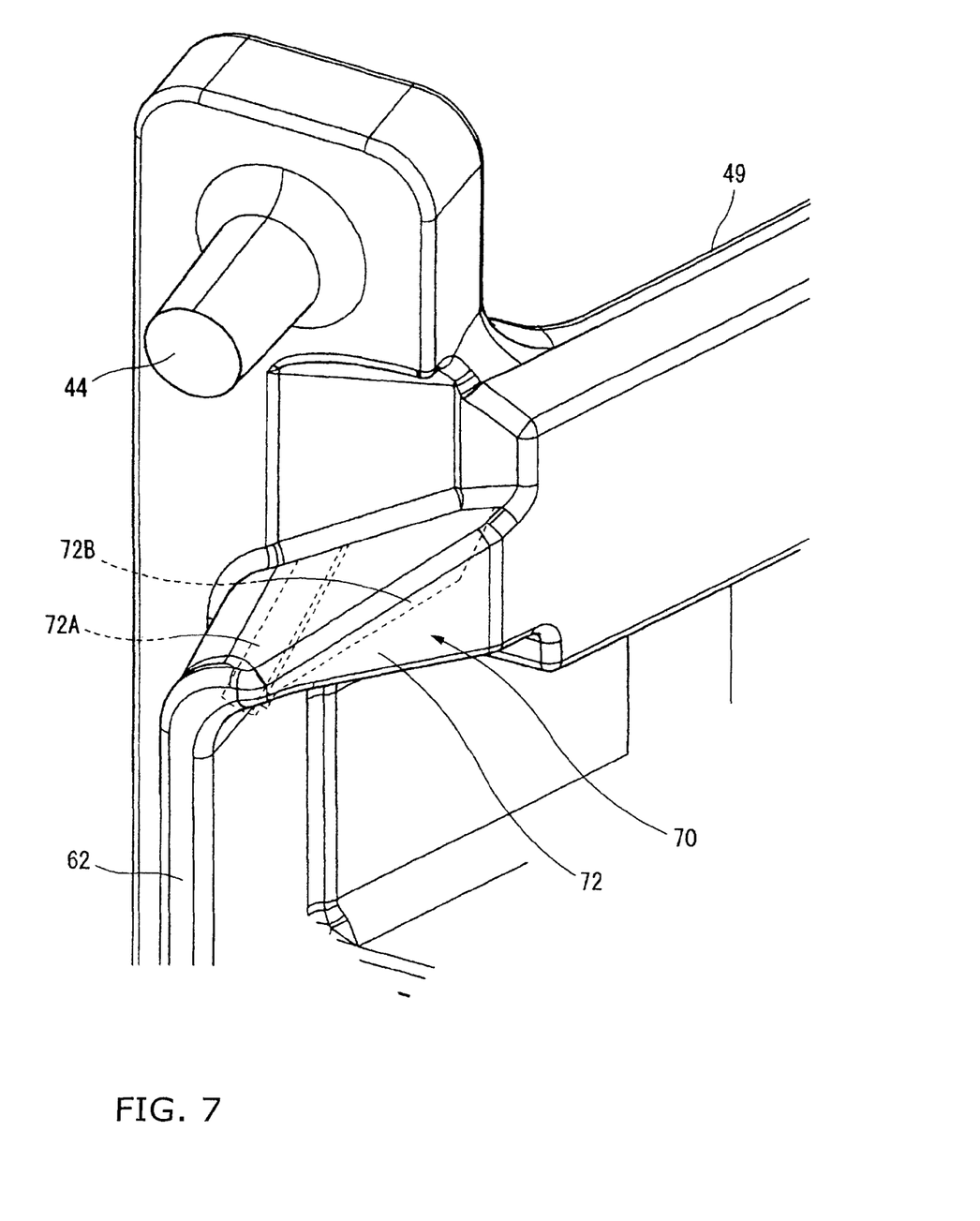
FIG. 7 is an enlarged oblique perspective view of an end portion of the cover and shows the seal structure of the electronic control apparatus according to the embodiment of the present invention.

Referring to FIGS. 1 to 10B, a seal structure according to this embodiment of the present invention will now be explained. FIGS. 4A to 5 are views showing a shape of the flat-to-groove linking seal portion 70 in the base 12. FIGS. 6A to 7 are views showing the shape of the flat-to-groove linking seal portion 70 in the cover 13. FIGS. 8A to 9E are views showing a relation among the flat seal portion 50, the connector-lower-surface-side flat seal portion 51, the groove seal portion 60 and the flat-to-groove linking seal portion 70.

As shown in FIGS. 3E and 8A-8C, the flat seal portion 50 is formed by charging sealant into the surface-joint portion between the upper surface 20aa of the attaching base portion 20a of the connector 20 and the inner surface of the upper-level portion 45 of the cover 13 which are opposed to each other, and also by charging sealant into the surface-joint portion between the both lateral surfaces 20ab of the attaching base portion 20a and the inner surfaces of the sloped lateral walls 49 of the cover 13 which are opposed to each other.

As shown in FIGS. 3E and 8A-8C, the connector-lower-surface-side flat seal portion 51 is formed by charging sealant into the surface-joint portion between the lower surface 20ac of the attaching base portion 20a of the connector 20 and the upper surface 31ba of the front wall 31b of the base 12.

Figure 2:
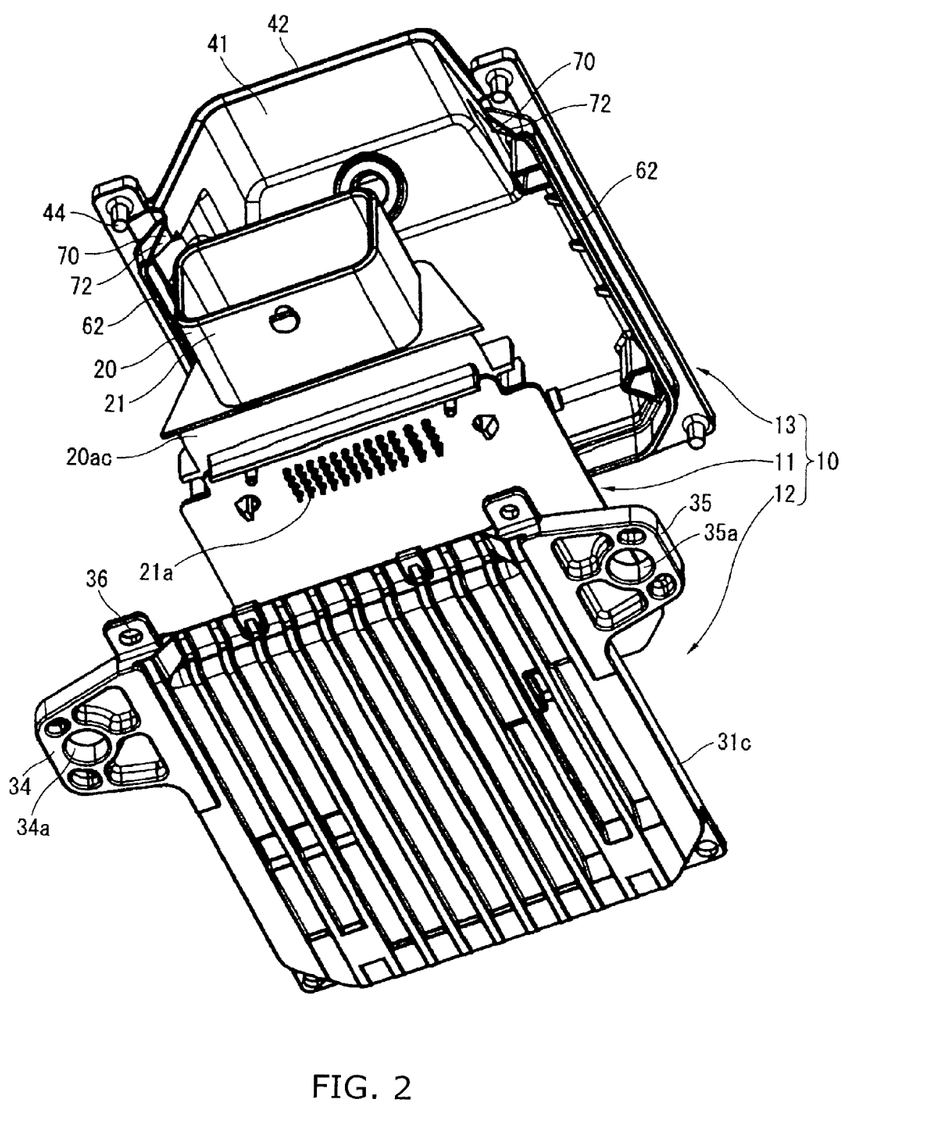
FIG. 2 is an exploded oblique perspective view showing the electronic control apparatus according to the embodiment of the present invention, as viewed from an obliquely lower direction.
Figures 3A, 3B:
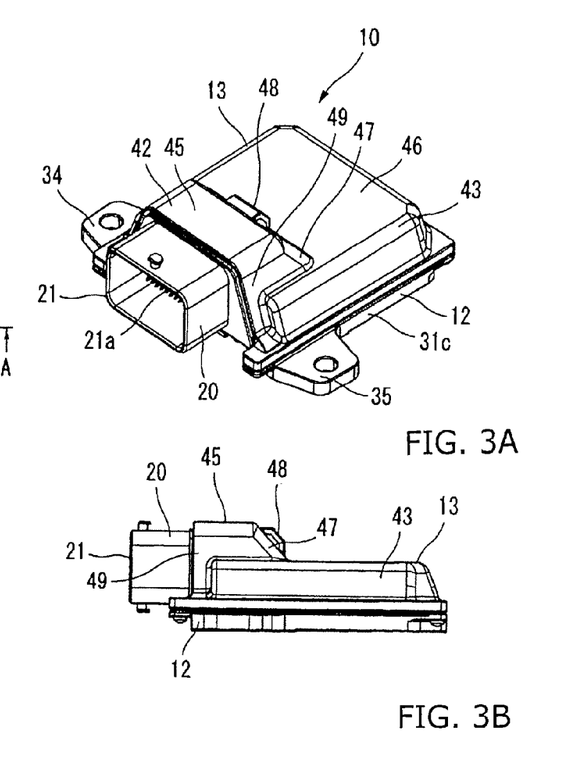
FIG. 3A is an oblique perspective view of the electronic control apparatus.
FIG. 3B is a right-side (lateral) view of the electronic control apparatus.
Figure 3C:
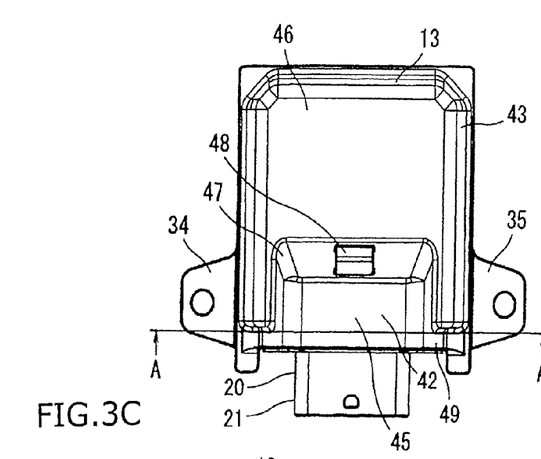
FIG. 3C is a top view of the electronic control apparatus.
Figure 3D:
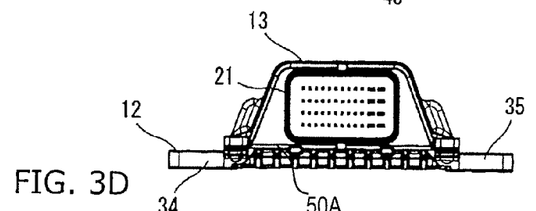
FIG. 3D is a front view of the electronic control apparatus.
Figure 3E:
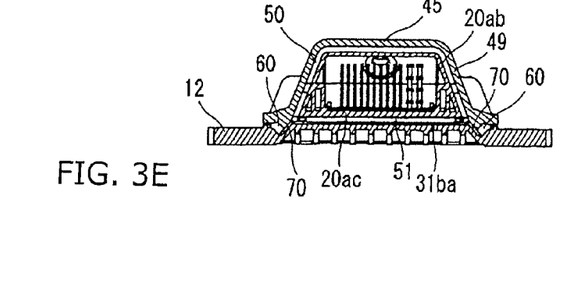
FIG. 3E is a cross-sectional view of FIG. 3C taken along a line A-A and as viewed in an arrow direction of FIG. 3C.

The groove seal portion 60 includes the seal groove 61 and the protrusion 62. The seal groove 61 is formed in a substantially U-shape in cross section to have the constant depth and the constant width, and is provided continuously in the back wall 31d and the lateral walls 31c of the base 12 as shown in FIGS. 4A to 4C. The protrusion 62 is formed in a portion of the inner circumferential surface of the cover 13 which is opposed to the seal groove 61, as shown in FIGS. 2 and 6A-6B. As shown in FIGS. 3E and 8A-8C, the groove seal portion 60 is formed by charging sealant into the clearance between the seal groove 61 and the protrusion 62 fitted in the seal groove 61.

Figures 8A, 8B:
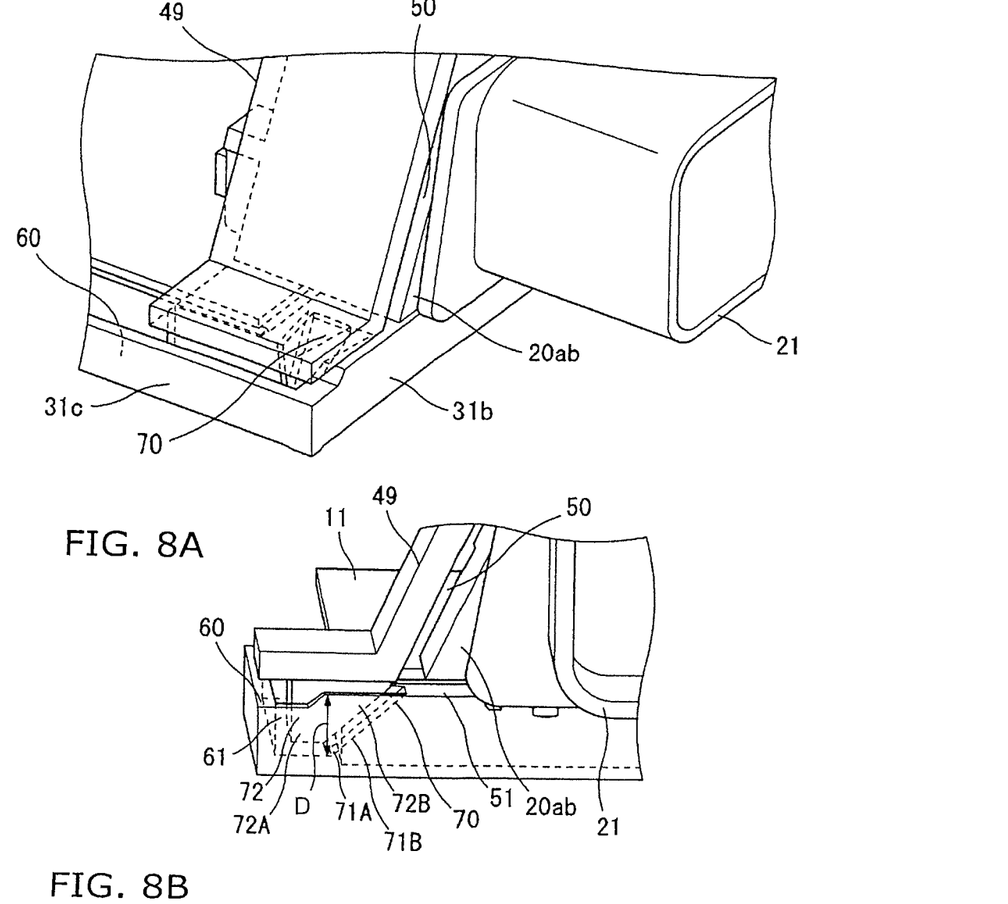
FIG. 8A is an oblique perspective view of the seal structure with some transparent portions.
FIG. 8B is a view of FIG. 8A with some transparent portions as viewed from the side of a connecting port of a connector.
Figure 8C:
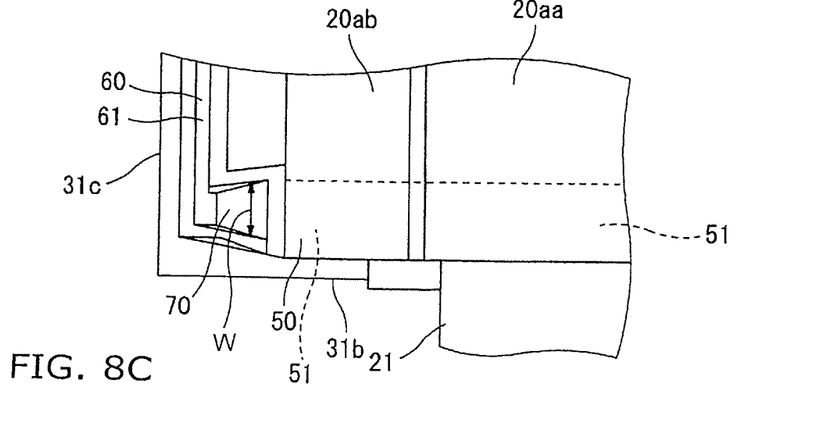
FIG. 8C is a top view of the seal structure without the cover.

As shown in FIGS. 8A to 8C, each flat-to-groove linking seal portion 70 is provided between the lateral-wall-side end portion of the connector-lower-surface-side flat seal portion 51 which is close to the lateral wall 31c and the front-wall-side end portion of the groove seal portion 60 which is close to the front wall 31b. That is, two of the flat-to-groove linking seal portions 70 are provided in this embodiment.

FIGS. 4A to 5 show a visual shape of the flat-to-groove linking seal portion 70 on the side of the base 12. FIGS. 6A to 7 show a visual shape of the flat-to-groove linking seal portion 70 on the side of the cover 13. FIGS. 8A to 9E show a detailed structure of the flat-to-groove linking seal portion 70.

FIGS. 8A to 8C are schematic views showing the flat-to-groove linking seal portion 70 and its surrounding portion. FIG. 8A is an oblique perspective view of the flat-to-groove linking seal portion 70 (with some transparent portions) as viewed obliquely from a side of the bracket 34. In FIG. 8A, the cover 13 is not shown except the sloped lateral wall 49.

FIG. 8B is a view of the flat-to-groove linking seal portion 70 (with some transparent portions) as viewed from a side of the connecting port 21 of the connector 20. FIG. 8C is a plain view of the flat-to-groove linking seal portion 70 without the cover 13, as viewed from a side of the upper surface 20aa of the attaching base portion 20a of the connector 20.

Figure 9A:
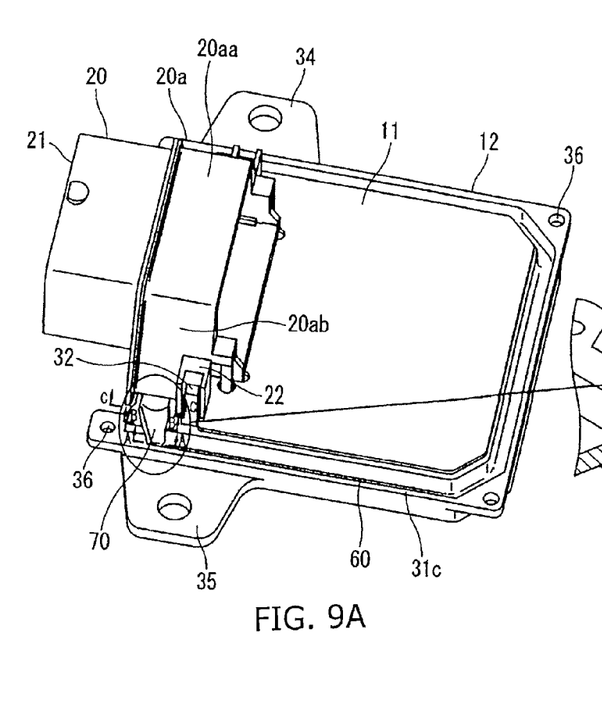
FIG. 9A is an oblique perspective view of the electronic control apparatus without the cover.
Figure 9B:
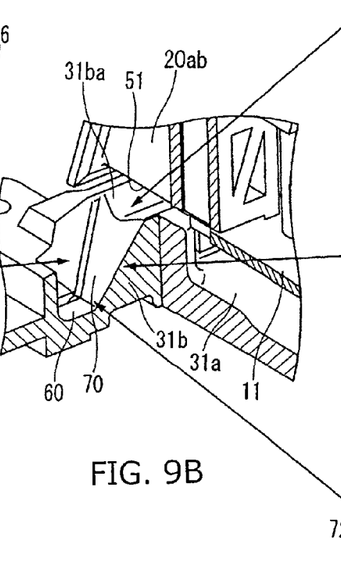
FIG. 9B is a view of a part of the seal structure with some cross-sections.
Figure 9C:
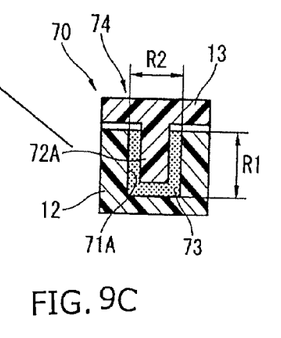
FIG. 9C is a view showing a relation between depth and width of a seal groove of a deep-bottom portion.
Figure 9D:
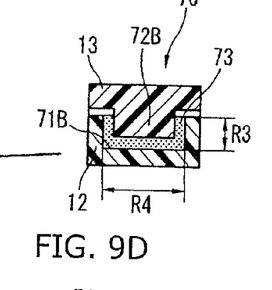
FIG. 9D is a view showing a relation between depth and width of a seal groove of a connecting portion.
Figure 9E:
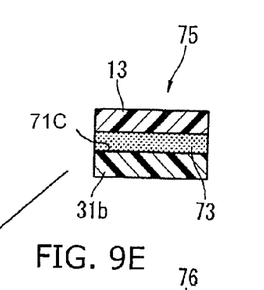
FIG. 9E is a view showing a relation between depth and width of a seal groove of a shallow-bottom portion.

FIG. 9A is a plain view without the cover 13. FIG. 9B is a cross-sectional view of a main part (an encircled region) of FIG. 9A. FIG. 9C is a cross-sectional view of the flat-to-groove linking seal portion 70, taken along a line A-A of FIG. 9A. FIG. 9D is a cross-sectional view of the flat-to-groove linking seal portion 70, taken along a line B-B of FIG. 9A. FIG. 9E is a cross-sectional view of the flat-to-groove linking seal portion 70, taken along a line C-C of FIG. 9A.

The flat-to-groove linking seal portion 70 is constituted by a seal groove 71 formed in the base 12 as shown in FIG. 9A and a protrusion 72 formed in the cover 13 (to protrude from the inner surface of the cover 13) as shown in FIG. 7. In this embodiment, shapes and dimensions (sizes) of the seal groove 71 and the protrusion 72 are varied in accordance with a locational point existing in the flat-to-groove linking seal portion 70. For example, such variations may be with respect to groove depth D and groove width W, as shown in FIGS. 8B and 8C. Further, a portion of the flat-to-groove linking seal portion 70 which is adjacent to (in contact with) the groove seal portion 60 is formed to be continuous with the groove seal portion 60. Specifically, as shown in FIG. 9C, the portion of the flat-to-groove linking seal portion 70 which is adjacent to the groove seal portion 60 forms a deep-bottom portion 74 including a seal groove 71A and a protrusion 72A. The seal groove 71A has a predetermined depth R1 and a predetermined groove width R2. The protrusion 72A is formed at a lower end portion of the sloped lateral wall 49 of the cover 13 as shown in FIG. 7, and is in a strip shape in cross section as shown in FIG. 9C. The protrusion 72A is fitted through a clearance into the seal groove 71A. That is, the predetermined depth R1 and the predetermined groove width R2 of the seal groove 71A are approximately equal to those of the seal groove 61 of the groove seal portion 60.

In the deep-bottom portion 74, an inner surface of the seal groove 71A faces an outer surface of the protrusion 72A through the predetermined clearance. This clearance is in a U-shape in cross section taken perpendicular to the surface of the bottom wall 31a and perpendicular to an extending direction of seal treatment, as shown in FIG. 9C, and is filled with the sealant 73. On the other hand, a portion of the flat-to-groove linking seal portion 70 which is adjacent to (in contact with) the connector-lower-surface-side flat seal portion 51 is formed to be continuous with the connector-lower-surface-side flat seal portion 51. Specifically, as shown in FIG. 9E, the portion of the flat-to-groove linking seal portion 70 which is adjacent to the connector-lower-surface-side flat seal portion 51 forms a shallow-bottom portion 75. This shallow-bottom portion 75 includes a seal groove 71C shallower than the seal groove 71A of the deep-bottom portion 74, and a protrusion shorter than the protrusion 72A of the deep-bottom portion 74. Especially in this embodiment, the seal groove of the shallow-bottom portion 75 is substantially omitted by setting the seal groove of the shallow-bottom portion 75 at a depth equal to 0. Thereby, also the protrusion corresponding to the seal groove of the shallow-bottom portion 75 is omitted. Hence, the shallow-bottom portion 75 constitutes a so-called flat seal structure such that a flat strip-shaped clearance given between (lateral-wall-side end portion of) the upper surface of the front wall 31b of the base 12 and the inner circumferential surface of the cover 13 (and the lower surface 20ac of the connector 20) opposed to the upper surface of the front wall 31b is filled with the sealant 73. Therefore, depth and width of the seal groove of the shallow-bottom portion 75 are approximately equal to those of the connector-lower-surface-side flat seal portion 51 so that the shallow-bottom portion 75 is continuous with the connector-lower-surface-side flat seal portion 51.

Moreover, the flat-to-groove linking seal portion 70 further includes a connecting portion 76 which links the deep-bottom portion 74 to the shallow-bottom portion 75 as shown in FIG. 9D. The connecting portion 76 includes a seal groove 71B and a protrusion 72B which is formed in a strip shape and is fitted through a predetermined clearance into the seal groove 71B, in the same manner as the deep-bottom portion 74. A sealing length (also called "leak path") of the deep-bottom portion 74, a sealing length of the shallow-bottom portion 75 and a sealing length of the connecting portion 76 are approximately equal to one another. That is, the flat-to-groove linking seal portion 70 is formed such that an entire range of the flat-to-groove linking seal portion 70 has a substantially constant sealing length.

It is noted that the "sealing length" means a length of the filling region of the sealant 73 interposed in the space (clearance) of the seal portion. For example, in the portion shown by FIG. 9C, the "sealing length" means a length (R2+(R1×2)) obtained by developing or deforming the U-shaped clearance filled with the sealant 73 into a linear shape in cross section.

Specifically, in order to equalize the sealing length, the widths of the seal groove and the protrusion of the shallow-bottom portion 75 are set to be larger than those of the deep-bottom portion 74. Moreover, a depth R3 of the seal groove 71B of the connecting portion 76 is set to be smaller than the depth R1 (R3<R1) of the seal groove 71A of the deep-bottom portion 74 whereas a groove width R4 of the seal groove 71B is set to be larger than the width R2 (R4>R2) of the seal groove 71A. The protrusion 72B of the connecting portion 76 is set along such a shape of the seal groove 71B. That is, a height (protruding amount) of the protrusion 72B is smaller than the height of the protrusion 72A of the deep-bottom portion 74 whereas a width of the protrusion 72B is larger than the width of the protrusion 72A of the deep-bottom portion 74. The connecting portion 76 is formed such that the depth R3 of the seal groove 71B becomes gradually larger from the shallow-bottom portion 75 toward the deep-bottom portion 74 and that the width R4 of the seal groove 71B becomes gradually smaller from the shallow-bottom portion 75 toward the deep-bottom portion 74. That is, the depth R3 of the seal groove 71B gradually varies from a value approximately equal to 0 to a value approximately equal to the depth R1, over the range of the connecting portion 76 existing between the shallow-bottom portion 75 and the deep-bottom portion 74. On the other hand, the width R4 of the seal groove 71B gradually varies from a value approximately equal to the sealing length of the connector-lower-surface-side flat seal portion 51 to a value approximately equal to the width R2, over the range of the connecting portion 76 existing between the shallow-bottom portion 75 and the deep-bottom portion 74. In the same manner, the height of the protrusion 72B gradually varies from a value approximately equal to 0 to a value approximately equal to the height of the protrusion 72A whereas the width of the protrusion 72B gradually varies from a value approximately equal to the sealing length of the connector-lower-surface-side flat seal portion 51 to a value approximately equal to the width of the protrusion 72A, over the range of the connecting portion 76 existing between the shallow-bottom portion 75 and the deep-bottom portion 74.

In this embodiment, the depth and width of the seal groove 71B of the connecting portion 76 are varied at a constant rate as shown in FIGS. 9A to 9E. However, according to the present invention, the variation rate of the depth or width of the seal groove 71B is not limited to a constant rate. The depth of the seal groove 71B may be gradually increased at any rate from the shallow-bottom portion 75 toward the deep-bottom portion 74 while gradually reducing the width of the seal groove 71B at the any rate from the shallow-bottom portion 75 toward the deep-bottom portion 74.

As mentioned above, in a so-called connector-side-exposed type in which the connector 20 attached to one side of the circuit board 11 is sandwiched between the base 12 and cover 13 constituting two members of the housing so as to expose a part of the connector 20 in a lateral direction of the housing (i.e., in parallel with the circuit board 11) as this embodiment; a connector seal portion is provided by charging sealant into a surface-joint portion (surface-contact portion) between the outer circumferential surface of the connector 20 and the inner circumferential surface of the housing over the entire circumference of the connector 20 in order to ensure the sealing performance of the inside of the housing.

In a case that a flat seal structure is employed for this connector seal portion, and a groove seal structure constituted by a seal groove and a protrusion fitted in the groove is employed for sealing a surface-joint portion between the base and the cover; there is a risk that the sealing length is not continuous (not smooth) at a connecting region between the flat seal structure and the groove seal structure so that a sufficient sealing performance is not secured. Moreover, in this case, the connecting region between the flat seal structure and the groove seal structure might include a stepped portion or a sharp edge portion so that a stress concentration tends to occur at this stepped portion or sharp edge portion.

Contrary to this, in the embodiment according to the present invention, the sealing length of the flat-to-groove linking seal portion 70 linking the connector-lower-surface-side flat seal portion 51 to the groove seal portion 60 is kept constant over all existing ranges of the deep-bottom portion 74, the shallow-bottom portion 75 and the connecting portion 76. Specifically, the widths of the seal groove and protrusion of the shallow-bottom portion 75 are larger than those of the deep-bottom portion 74. Moreover, the depth of the seal groove 71B and the height of the protrusion 72B of the connecting portion 76 are gradually enlarged from the shallow-bottom portion 75 toward the deep-bottom portion 74 whereas the widths of the seal groove 71B and the protrusion 72B are gradually reduced from the shallow-bottom portion 75 toward the deep-bottom portion 74. That is, the depth of the seal groove 71B and the height of the protrusion 72B of the connecting portion 76 become larger as a measurement point for these depth and height (i.e., a cross-section-taking point as shown by FIGS. 9C to 9E) becomes closer to the deep-bottom portion 74 whereas the widths of the seal groove 71B and the protrusion 72B become smaller as a measurement point for these widths becomes closer to the deep-bottom portion 74. Thereby, each of a bottom surface of the seal groove of the flat-to-groove linking seal portion 70 and a top surface of the protrusion of the flat-to-groove linking seal portion 70 is substantially in a trapezoidal shape as shown in FIGS. 7 and 9B.

By virtue of such a configuration, the predetermined sealing length can be kept over the entire region of the flat-to-groove linking seal portion 70. That is, a sum of the width and twice the depth of the seal groove (i.e., a total length along a shape in cross section of the seal groove) is kept constant over the entire region of the groove seal portion 60 and the flat-to-groove linking seal portion 70. This sum is equal also to a sealing width (contact width in cross section taken perpendicular to the extending direction of seal treatment, i.e., sealing length) of the connector-lower-surface-side flat seal portion 51. In this embodiment, this sum may be equal to the sealing length (i.e., sealing contact width) of the flat seal portion 50. Moreover, because the seal groove of the shallow-bottom portion 75 formed to be directly continuous with the connector-lower-surface-side flat seal portion 51 is designed to be shallow, a thickness dimension of the housing sandwiching the connector 20 as shown in FIG. 10A can be reduced as compared with a thickness dimension (up-down-directional dimension) of a housing 3 of the comparative example shown in FIG. 10B. Accordingly, a downsizing and a vehicle mountability of the electronic control apparatus can be enhanced.

Moreover, in this embodiment, the depth (height) and width of the seal groove or protrusion are gradually varied in the connecting portion 76 linking the shallow-bottom portion 75 to the deep-bottom portion 74. Hence, there is no stepped portion or sharp edge portion functioning as a structural inflection point although the depth of the seal groove of the shallow-bottom portion 75 is different from the depth of the seal groove of the deep-bottom portion 74 as mentioned above. Therefore, the sealing performance can be improved while avoiding or relieving the occurrence of stress concentration.

Next, the representative configurations and effects according to the embodiments of the present invention will now be listed.

A seal structure for an electronic control apparatus including a circuit board (11), a connector (20) attached to one side of the circuit board (11), and a housing having an upper housing member (13) and a lower housing member (12) between which the connector (20) is sandwiched in a thickness direction of the circuit board (11) includes a connector-lower-surface-side flat seal portion (51) constituted by a surface-joint portion filled with sealant between a lower surface (20ac) of the connector (20) and the lower housing member (12); a groove seal portion (60) constituted by a clearance filled with sealant between a groove (61) and a protrusion (62) fitted into the groove (61); and a linking seal portion (70). The groove (61) is provided in one of inner surfaces of outer circumferential edge portions of the upper housing member (13) and the lower housing member (12). The protrusion (62) is provided in another of the inner surfaces of the outer circumferential edge portions of the upper housing member (13) and the lower housing member (12). The linking seal portion (70) connects the connector-lower-surface-side flat seal portion (51) with the groove seal portion (60). The linking seal portion (70) includes a deep-bottom portion (74) having a seal groove (71A) continuous with the groove seal portion (60), a shallow-bottom portion (75) having a seal groove shallower than the seal groove (71A) of the deep-bottom portion (74) and continuous with the connector-lower-surface-side flat seal portion (51), and a connecting portion (76) linking the deep-bottom portion (74) to the shallow-bottom portion (75).

Accordingly, a constant sealing length can be kept so as to suppress the reduction in sealing property while improving the mountability and downsizing of the electronic control apparatus.

Although the invention has been described above with reference to certain embodiments of the invention, the invention is not limited to the embodiments described above. Modifications and variations of the embodiments described above will occur to those skilled in the art in light of the above teachings.

This application is based on a prior Japanese Patent Application No. 2012-193677 filed on Sep. 4, 2012. The entire contents of this Japanese Patent Application are hereby incorporated by reference.

The scope of the invention is defined with reference to the following claims.

What is claimed is:

1. A seal structure for an electronic control apparatus,
wherein the electronic control apparatus includes a circuit board, a connector attached to one side of the circuit board, and a housing having an upper housing member and a lower housing member between which the connector is sandwiched in a thickness direction of the circuit board,
wherein the seal structure comprises:
a connector-lower-surface-side flat seal portion constituted by a surface joint portion filled with sealant between a lower surface of the connector and the lower housing member;
a groove seal portion constituted by a clearance filled with sealant between a groove and a protrusion fitted into the groove, the groove being provided in one of inner surfaces of outer circumferential edge portions of the upper housing member and the lower housing member, the protrusion being provided in another of the inner surfaces of the outer circumferential edge portions of the upper housing member and the lower housing member; and
a linking seal portion connecting the connector-lower-surface-side flat seal portion with the groove seal portion, the linking seal portion including
a deep-bottom portion having a seal groove continuous with the groove seal portion,
a shallow-bottom portion having a seal groove shallower than the seal groove of the deep-bottom portion and continuous with the connector-lower-surface-side flat seal portion, and a connecting portion linking the deep-bottom portion to the shallow-bottom portion.

2. The seal structure according to claim 1, wherein
a seal groove of the connecting portion has a depth increased gradually from a depth of the seal groove of the shallow-bottom portion to a depth of the seal groove of the deep-bottom portion, and
the seal groove of the connecting portion has a width reduced gradually from a width of the seal groove of the shallow-bottom portion to a width of the seal groove of the deep-bottom portion.

3. The seal structure according to claim 2, wherein
a bottom surface of the seal groove of the connecting portion is substantially in a trapezoidal shape.

4. The seal structure according to claim 1, wherein
the connecting portion is formed such that a sealing length defined by a shape in cross section of a seal groove of the connecting portion is constant over an entire range of the linking seal portion.

5. The seal structure according to according to claim 4, wherein
the sealing length defined by the shape in cross section of the seal groove of the connecting portion is substantially equal to a sealing length defined by a shape in cross section of the groove of the groove seal portion.

6. The seal structure according to claim 1, wherein
a surface of the lower housing member which is opposed to the lower surface of the connector is in a curved shape in a range of the connector-lower-surface-side flat seal portion.

* * * * *